(12) United States Patent
Jung et al.

(10) Patent No.: US 10,475,960 B2
(45) Date of Patent: Nov. 12, 2019

(54) LIGHT EMITTING DEVICE HAVING GALLIUM NITRADE SUBSTRATE

(71) Applicant: LG INNOTEK CO., LTD., Seoul (KR)

(72) Inventors: Sung Dal Jung, Seoul (KR); Hyun Don Song, Seoul (KR); Ki Man Kang, Seoul (KR); Seung Hwan Kim, Seoul (KR); Jong Sub Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/764,112

(22) PCT Filed: Sep. 30, 2016

(86) PCT No.: PCT/KR2016/011025
§ 371 (c)(1),
(2) Date: Mar. 28, 2018

(87) PCT Pub. No.: WO2017/057978
PCT Pub. Date: Apr. 6, 2017

(65) Prior Publication Data
US 2019/0058088 A1      Feb. 21, 2019

(30) Foreign Application Priority Data
Sep. 30, 2015   (KR) .................. 10-2015-0137809

(51) Int. Cl.
*H01L 33/32* (2010.01)
*H01L 33/00* (2010.01)
(Continued)

(52) U.S. Cl.
CPC .............. *H01L 33/32* (2013.01); *H01L 33/00* (2013.01); *H01L 33/0075* (2013.01);
(Continued)

(58) Field of Classification Search
CPC ........ H01L 33/26; H01L 33/405; H01L 33/32
See application file for complete search history.

(56) References Cited

U.S. PATENT DOCUMENTS

| 8,937,321 B2 * | 1/2015 | Kim ................... H01L 33/0079 257/79 |
| 2014/0061711 A1 * | 3/2014 | Yokoyama .............. H01L 33/38 257/99 |

(Continued)

FOREIGN PATENT DOCUMENTS

| JP | 2011-066304 | 3/2011 |
| JP | 2011-108859 | 6/2011 |

(Continued)

OTHER PUBLICATIONS

International Search Report (with English Translation) and Written Opinion dated Dec. 28, 2016 issued in Application No. PCT/KR2016/011025.

*Primary Examiner* — Quoc D Hoang
(74) *Attorney, Agent, or Firm* — Ked & Associates, LLP (57) ABSTRACT

Disclosed in an embodiment is a light emitting device comprising: a substrate; a light emitting structure, which includes a first semiconductor layer, an active layer, a second semiconductor layer, and a first groove penetrating through the second semiconductor layer and the active layer and disposed up until a partial region of the first semiconductor layer; a reflective electrode layer covering a lower part of the second semiconductor layer and a sidewalls of the first groove; a first ohmic electrode disposed inside the first groove and electrically connected to the first semiconductor layer; and a first insulation layer for electrically insulating the first ohmic electrode and the reflective electrode layer.

20 Claims, 8 Drawing Sheets

(51) Int. Cl.
　　 *H01L 33/12* (2010.01)
　　 *H01L 33/14* (2010.01)
　　 *H01L 33/20* (2010.01)
　　 *H01L 33/36* (2010.01)
　　 *H01L 33/38* (2010.01)
　　 *H01L 33/40* (2010.01)
　　 *H01L 33/44* (2010.01)
　　 *H01L 33/50* (2010.01)
　　 *H01L 33/62* (2010.01)
　　 *H01L 33/60* (2010.01)
(52) U.S. Cl.
　　 CPC .............. *H01L 33/12* (2013.01); *H01L 33/14* (2013.01); *H01L 33/20* (2013.01); *H01L 33/36* (2013.01); *H01L 33/382* (2013.01); *H01L 33/405* (2013.01); *H01L 33/44* (2013.01); *H01L 33/505* (2013.01); *H01L 33/62* (2013.01); *H01L 33/60* (2013.01); *H01L 2933/0016* (2013.01); *H01L 2933/0025* (2013.01)

(56) References Cited

U.S. PATENT DOCUMENTS

2016/0133788 A1* 5/2016 Kim .................. H01L 33/20
　　　　　　　　　　　　　　　　　　　　　　　 257/98
2016/0276628 A1* 9/2016 Fogel ................ H01L 51/5275

FOREIGN PATENT DOCUMENTS

| KR | 10-2012-0031342 | 4/2012 |
| KR | 10-2012-0138725 | 12/2012 |
| KR | 10-2014-0002984 | 1/2014 |

* cited by examiner

LIGHT EMITTING DEVICE HAVING GALLIUM NITRADE SUBSTRATE

CROSS-REFERENCE TO RELATED PATENT APPLICATIONS

This application is a U.S. National Stage Application under 35 U.S.C. § 371 of PCT Application No. PCT/KR2016/011025, filed Sep. 30, 2016, which claims priority to Korean Patent Application No. 10-2015-0137809, filed Sep. 30, 2015, whose entire disclosures are hereby incorporated by reference.

TECHNICAL FIELD

The present invention relates to a light emitting device.

BACKGROUND ART

A light emitting diode (LED) device is a compound semiconductor device which converts electrical energy into light energy. The LED may implement various colors by adjusting a composition ratio of a compound semiconductor.

When compared to existing light sources such as a fluorescent lamp and an incandescent lamp, a nitride semiconductor LED has advantages, such as lower energy consumption, semi-permanent life span, rapid response speed, stability, and environmental friendliness. Accordingly, an application range of the nitride semiconductor LED has been extended to LED backlights capable of replacing a cold cathode fluorescent lamp (CCFL) constituting a backlight of a liquid crystal display (LCD) device, white LED lighting devices capable of replacing a fluorescent lamp or an incandescent lamp, vehicle headlights, and signal lamps.

Generally, a gallium nitride-based LED is grown on a sapphire substrate. However, since a sapphire substrate is hard and electrically nonconductive and has low thermal conductivity, a sapphire substrate is faces limitations in reducing manufacturing costs through size reduction of the gallium nitride-based LED and improving light output and characteristics of a chip.

In existing InGaN LEDs grown on a sapphire substrate, a silicon carbide substrate, a silicon substrate, and the like, a droop phenomenon in which internal quantum efficiency decreases as current density increases may occur, and reliability problems such as current crowding may occur.

Therefore, in order to develop an LED having characteristics such as high efficiency and high current, there is a need to develop an LED using a GaN bulk substrate having a small lattice mismatch and low dislocation density.

DISCLOSURE

Technical Problem

The present invention is directed to providing a light emitting device using a gallium nitride (GaN) substrate.

In addition, the present invention is directed to providing a light emitting device having improved light extraction efficiency.

Technical Solution

One aspect of the present invention provides a light emitting device including a substrate; a light emitting structure including a first semiconductor layer, an active layer, and a second semiconductor layer, and having a first groove which passes through the second semiconductor layer and the active layer and is disposed to occupy a partial region of the first semiconductor layer; a reflective electrode layer covering a lower portion of the second semiconductor layer and sidewalls of the first groove; a first ohmic electrode electrically connected to the first semiconductor layer through the first groove; and a first insulating layer electrically insulating the first ohmic electrode and the reflective electrode layer from each other.

The first insulating layer may be disposed between the reflective electrode layer and the light emitting structure.

The light emitting device may include a second insulating layer covering the reflective electrode layer, a first electrode pad penetrating the second insulating layer so as to be electrically connected to the first ohmic electrode, and a second electrode pad penetrating the second insulating layer so as to be electrically connected to the reflective electrode layer.

An area of the first ohmic electrode may gradually increase toward the substrate, and an area of the first electrode pad may gradually decrease toward the substrate.

The reflective electrode layer may be electrically connected to the second semiconductor layer.

A contact area between the first ohmic electrode and the first semiconductor layer may be 1% to 10% of a total area of the active layer.

The substrate may include a first layer in contact with the first semiconductor layer.

A dopant concentration of the first layer may be higher than a dopant concentration of a third layer adjacent to the first layer.

The dopant concentration of the first layer may be in a range of $1\times10^{18}$ cm$^{-3}$ to $5\times10^{19}$ cm$^{-3}$.

A thickness of the first layer may be 40% to 50% of a total thickness of the substrate.

A thickness of the first layer may be greater than a thickness of the first semiconductor layer.

The substrate may have a thickness of 80 μm to 300 μm, and a light extraction structure may have a height of 10 μm to 30 μm.

Advantageous Effects

According to an exemplary embodiment, a lattice mismatch can be prevented by using a GaN substrate.

In addition, reflection efficiency can be increased by a reflective electrode layer formed entirely on a light emitting structure.

Furthermore, light extraction efficiency can be improved by reducing a contact area between a first semiconductor layer and an electrode.

The various and advantageous advantages and effects of the present invention are not limited to the above description, and may be more easily understood in the course of describing a specific exemplary embodiment of the present invention.

MODES OF THE INVENTION

While the present invention is open to various modifications and alternative embodiments, specific embodiments thereof will be described and shown by way of example in the drawings. However, it should be understood that there is no intention to limit the present invention to the particular embodiments disclosed, and, to the contrary, the present invention is to cover all modifications, equivalents, and alternatives falling within the spirit and scope of the present invention.

It should be understood that, although terms including ordinal numbers such as "first," "second," and the like may be used herein to describe various elements, the elements are not limited by the terms. The terms are only used to distinguish one element from another. For example, a second element could be termed a first element without departing from the scope of the claims of the present inventive concept, and similarly a first element could be also termed a second element. The term "and/or" includes any and all combinations of a plurality of associated listed items.

The terminology used herein is for the purpose of describing particular embodiments only and is not intended to limit the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof but do not preclude the presence or addition of one or more other features, integers, steps, operations, elements, components, and/or groups thereof.

It should be understood that, when an element is referred to as being "on" or "under" another element, the element may be directly on/under the other element, and/or one or more intervening elements may also be present. When an element is referred to as being "on" or "under" another element, the meaning thereof may include the element being "on the other element" as well as being "under the other element."

Hereinafter, example embodiments will be described with reference to the attached drawings, and the same or corresponding elements will be given the same reference numbers regardless of drawing symbols, and redundant descriptions will be omitted.

Figure 1:
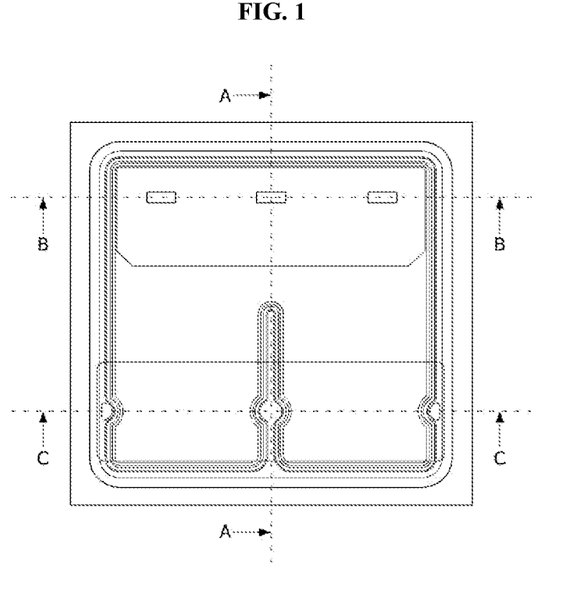
FIG. 1 is a plan view illustrating a light emitting device according to an exemplary embodiment of the present invention.
Figure 2:
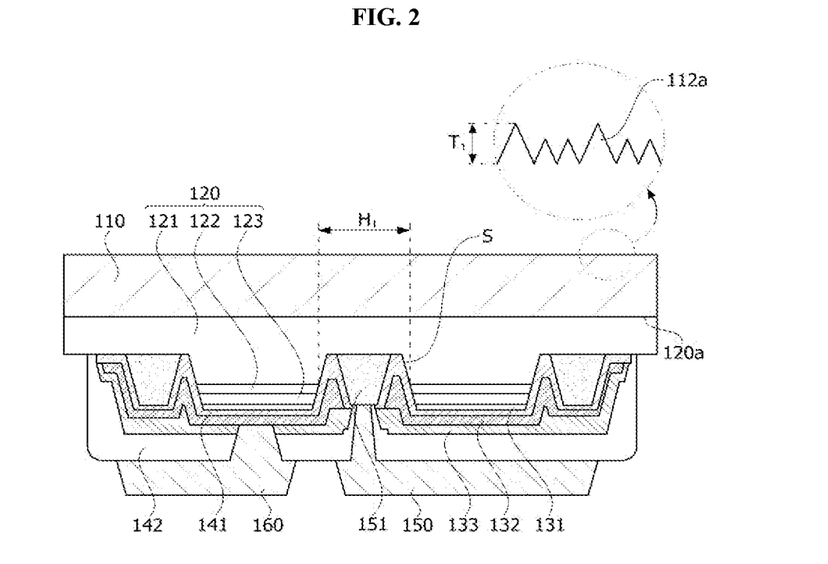
FIG. 2 is a cross-sectional view illustrating the light emitting device of FIG. 1.

FIG. 1 is a plan view illustrating a light emitting device according to an exemplary embodiment of the present invention, and FIG. 2 is a cross-sectional view illustrating the light emitting device of FIG. 1. FIG. 2 is a cross-sectional view taken along line A-A of the light emitting device of FIG. 1. Line A-A may be adjusted in an appropriate direction so as to show a cross section of FIG. 2.

Referring to FIGS. 1 and 2, the light emitting device according to the exemplary embodiment of the present invention includes a light emitting structure 120 including a first semiconductor layer 121, an active layer 122, and a second semiconductor layer 123, a substrate 110 disposed on one surface 120a of the light emitting structure 120 and including gallium nitride, a reflective electrode layer 132 covering the other surface of the light emitting structure 120 and sidewalls S of a first groove H1, a first ohmic electrode 151 electrically connected to the first semiconductor layer 121 through the first groove H1, and a first insulating layer 141 electrically insulating the first ohmic electrode 151 and the reflective electrode layer 132 from each other.

The substrate 110 may be manufactured by growing gallium nitride (GaN). A lattice mismatch is formed due to a lattice constant mismatch between a generally used sapphire substrate and a gallium nitride-based semiconductor layer. A strong piezoelectric field is applied to the light emitting structure 120 by the lattice mismatch to reduce quantum efficiency.

According to an exemplary embodiment, problems caused by the lattice mismatch can be solved using the gallium nitride substrate 110. In addition, a buffer layer for preventing the lattice mismatch may be omitted. Hereinafter, the gallium nitride substrate will be defined as a substrate for convenience.

The substrate 110 has a plurality of light extraction structures 112a formed on one surface thereof. The plurality of light extraction structures 112a may have different heights. The substrate 110 may have a thickness of 80 μm to 300 μm. When the thickness is less than 80 μm, warpage may occur in the substrate 110 to cause a device defect, and when the thickness is greater than 300 μm, a dopant may be difficult to uniformly control in the substrate.

A height T1 of the light extraction structures 112a may be in a range of 10 μm to 30 μm. As described later, when the height is less than 10 μm, a light extraction structure may not be formed in some regions, and thus light may not be extracted. When the height is greater than 30 μm, light extraction efficiency may not be further increased.

The light emitting structure 120 is disposed on a lower portion of the substrate 110 with reference to drawings and includes the first semiconductor layer 121, the active layer 122, and the second semiconductor layer 123. Generally, the above-described light emitting structure 120 may be divided into a plurality of light emitting structures by cutting the substrate 110.

The first semiconductor layer 121 may be a III-V group or II-IV group compound semiconductor or the like, and may be doped with a first dopant. The first semiconductor layer 121 may be made of at least one material selected from semiconductor materials having an empirical formula of $In_{x1}Al_{y1}Ga_{1-x1-y1}N$ ($0 \le x1 \le 1$, $0 \le y1 \le 1$, and $0 \le x1+y1 \le 1$), such as GaN, AlGaN, InGaN, and InAlGaN. The first dopant may be an n-type dopant such as Si, Ge, Sn, Se, or Te. When the first dopant is the n-type dopant, the first semiconductor layer 121 doped with the first dopant may be an n-type semiconductor layer.

The active layer 122 is a layer in which electrons (or holes) injected through the first semiconductor layer 121 meet holes (or electrons) injected through the second semiconductor layer 123. As electrons and holes are recombined and transition to a low energy level, the active layer 122 may generate light having a wavelength corresponding thereto. There is no restriction on a light emitting wavelength in the present exemplary embodiment.

The active layer 122 may have any one of a single well structure, a multi well structure, a single quantum well structure, a multi quantum well (MQW) structure, a quantum dot structure, and a quantum line structure, but a structure thereof is not limited thereto.

The second semiconductor layer 123 may be implemented using a III-V group or II-IV group compound semiconductor or the like, and may be doped with a second dopant. The second semiconductor layer 123 may be made of a semiconductor material having an empirical formula of $In_{x5}Al_{y2}Ga_{1-x5-y2}N$ ($0 \le x5 \le 1$, $0 \le y2 \le 1$, and $0 \le x5+y2 \le 1$), or may be made of a material selected from AlInN, AlGaAs, GaP, GaAs, GaAsP, and AlGaInP. When the second dopant is a p-type dopant such as Mg, Zn, Ca, Sr, or Ba, the second semiconductor layer 123 doped with the second dopant may be a p-type semiconductor layer.

Although not shown, an electron blocking layer (EBL) may be disposed between the active layer 122 and the second semiconductor layer 123. The EBL may block electrons supplied by the first semiconductor layer 121 from flowing into the second semiconductor layer 123, and thus may increase the likelihood of recombination of electrons and holes in the active layer 122.

The first groove H1 may be formed in the light emitting structure 120 so as to pass through the second semiconductor layer 123 and the active layer 122 and expose the first semiconductor layer 121. The first semiconductor layer 121 may be partially etched so as to form the first groove H1. A plurality of the first groove H1 may be provided. The first ohmic electrode 151 may be disposed in the first groove H1 and may be electrically connected to the first semiconductor layer 121. A second ohmic electrode 131 may be disposed on a lower portion of the second semiconductor layer 123.

The first ohmic electrode 151 and the second ohmic electrode 131 may include at least one selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SnO, InO, INZnO, ZnO, IrOx, RuOx, NiO, Ti, Al, Ni, Cr, and a selective compound or alloy thereof, and may be formed in at least one layer. A thickness of the ohmic electrodes is not particularly limited.

The first insulating layer 141 may cover the other surface of the light emitting structure 120 and the sidewalls S of the first groove H1. The first insulating layer 141 may entirely cover the light emitting structure 120 and the first ohmic electrode 151 except for a point at which the first ohmic electrode 151 is connected to a first electrode pad 150.

The first insulating layer 141 may include an insulating material or an insulating resin made of at least one of oxides, nitrides, fluorides, and sulfides, which include at least one selected from Al, Cr, Si, Ti, Zn, and Zr. The first insulating layer 141 may be made of at least one selected from, for example, $SiO_2$, $Si_3N_4$, $Al_2O_3$, and $TiO_2$. The first insulating layer 141 may be formed in a single layer or multiple layers, but the present invention is not limited thereto.

The reflective electrode layer 132 may be disposed on a lower portion of the first insulating layer 141 to cover the other surface of the light emitting structure 120 and the sidewalls S of the first groove H1. The reflective electrode layer 132 may be formed entirely on the light emitting structure 120 excluding a portion at which the first ohmic electrode 151 is connected to the first electrode pad 150. Due to such a configuration, most of the light emitted toward the second semiconductor layer 123 from the active layer 122 may reflected toward the substrate 110. Therefore, reflection efficiency can be increased, and light extraction efficiency can be improved The reflective electrode layer 132 may be made of a metallic or non-metallic material. The metallic reflective electrode layer 132 may include any one metal selected from In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi.

A non-metallic reflective layer may have a structure in which at least two of a pair including a first layer having a first refractive index and a second layer having a second refractive index are alternately stacked. The first refractive index and the second refractive index may be different from each other, and each of the first layer and the second layer may be made of a conductive material or an insulating material, which have a refractive index of 1.5 to 2.4. The structure may be a distributed Bragg reflection (DBR) structure. In addition, the structure may be a structure (omnidirectional reflector) in which a dielectric layer with a low refractive index and a metal layer are stacked.

A light extraction structure such as a roughness may be formed on a surface of at least one of the second semiconductor layer 123 and the reflective electrode layer 132. Such a light extraction structure can improve light extraction efficiency by changing a critical angle of incident light. The light extraction structure may have uneven patterns or a plurality of protrusions.

A capping electrode 133 may be disposed on a lower portion of the reflective electrode layer 132. The capping electrode 133 may perform at least one of a role as a diffusion prevention layer, a role as a current distribution layer, and a role of protecting the reflective electrode layer 132. The capping electrode 133 may be made of one selected from Au, Cu, Hf, Ni, Mo, V, W, Rh, Ru, Pt, Pd, La, Ta, Ti, and an alloy of at least two thereof.

A second insulating layer 142 is disposed on a lower portion of the capping electrode 133. The second insulating layer 142 may include an insulating material or an insulating resin made of at least one of oxides, nitrides, fluorides, and sulfides, which include at least one selected from Al, Cr, Si, Ti, Zn, and Zr. The second insulating layer 142 may be made of at least one selected from, for example, $SiO_2$, $Si_3N_4$, $Al_2O_3$, and $TiO_2$. The second insulating layer 142 may be formed in a single-layer or a multi-layer, but the present invention is not limited thereto.

The first electrode pad 150 may penetrate the second insulating layer 142 and may be electrically connected to the first ohmic electrode 151. An area of the first ohmic electrode 151 gradually increases toward the substrate 110, and an area of the first electrode pad 150 gradually decreases toward the substrate 110.

A second electrode pad 160 may penetrate the second insulating layer 142 and may be electrically connected to the second ohmic electrode 131 and the reflective electrode layer 132.

The first electrode pad 150 and the second electrode pad 160 may include any one metal selected from In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi.

Figure 3:
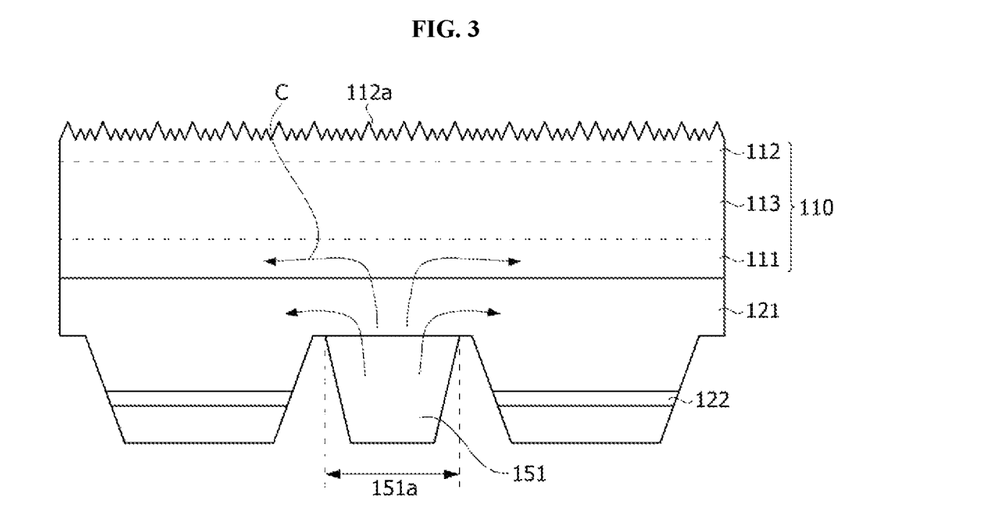
FIG. 3 is a conceptual view illustrating a current distribution function of a substrate according to an exemplary embodiment of the present invention.
Figure 4:
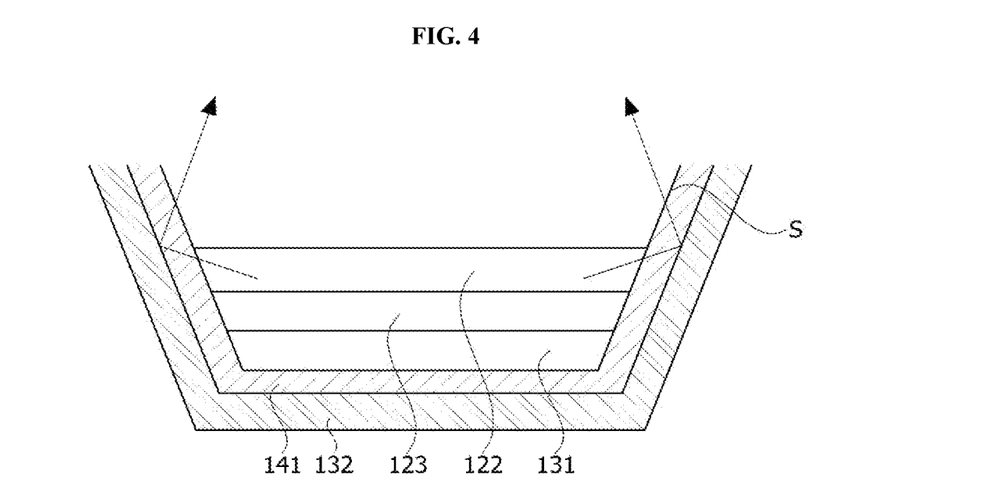
FIG. 4 is a conceptual view illustrating a reflective electrode layer of FIG. 2.
Figure 5:
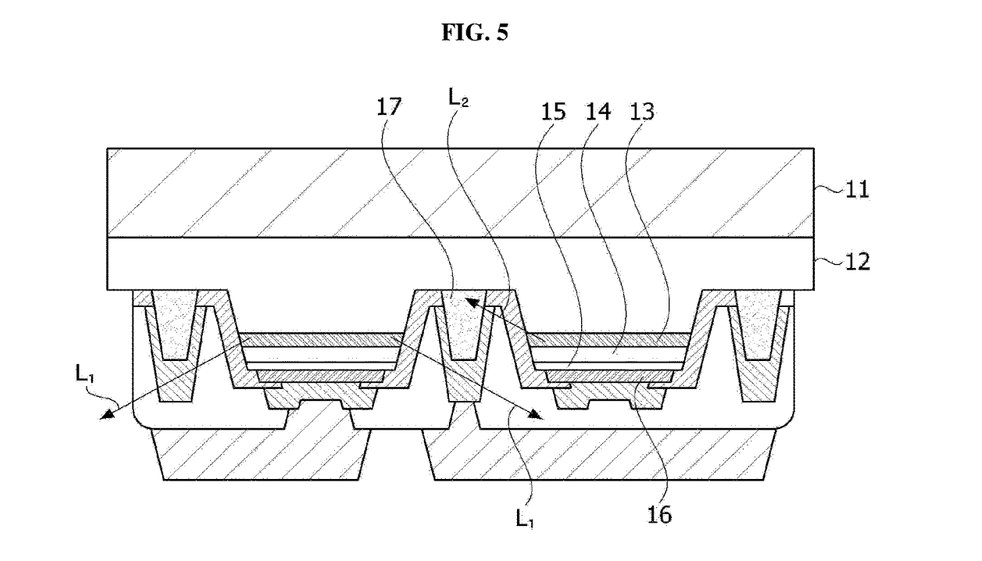
FIG. 5 is a conceptual view illustrating an existing light emitting device.

FIG. 3 is a conceptual view illustrating a current distribution function of the substrate according to the exemplary embodiment of the present invention. FIG. 4 is a conceptual view illustrating the reflective electrode layer of FIG. 2. FIG. 5 is a conceptual view illustrating an existing light emitting device.

Referring to FIG. 3, the substrate 110 may include a first layer 111 facing the first semiconductor layer 121, a second layer 112 through which light is emitted to the outside, and a third layer 113 disposed between the first layer 111 and the second layer 112.

When a current is applied to the first semiconductor layer 121 through the first ohmic electrode 151, the first layer 111 may form a current distribution path C. The current can be effectively distributed through the first layer 111. Therefore, even when a contact area 151a is reduced between the first ohmic electrode 151 and the first semiconductor layer 121, an operating voltage (Vf) can be maintained. To this end, a dopant concentration of the first layer 111 may be relatively high. Specifically, the dopant concentration of the first layer 111 may be in a range of $1 \times 10^{18}$ cm$^{-3}$ to $5 \times 10^{19}$ cm$^{-3}$.

A dopant concentration of the second layer 112 may be the same as that of the first layer 111. The second layer 112 may form the light extraction structures 112a by wet etching. The light extraction structures may be a hexagonal-shaped unevenness. As a dopant concentration becomes higher, Ga and N can be easily separated.

The height of the light extraction structures 112a may be in a range of 10 μm to 30 μm. An even surface (non-etched region) may be formed between the plurality of light extraction structures. An area occupied by the light extraction structures 112a may be 60% or more of a total area of the substrate. When the area occupied by the light extraction structures 112a is 60% or less of the total area, an area in which the light extraction structure is not formed can be widened, resulting in a reduction in light extraction efficiency.

A dopant concentration of the third layer 113 may be lower than that of each of the first layer 111 and the second layer 112. When a dopant concentration is in a range of $1 \times 10^{18}$ cm$^{-3}$ to $5 \times 10^{19}$ cm$^{-3}$ in a thickness direction of the substrate 110, it is difficult to secure desired transparency and crystallinity. Therefore, the desired transparency and crystallinity can be secured in the substrate 110 by relatively lowering the dopant concentration of the third layer 113.

In an example, the dopant concentration of the third layer 113 may be less than or equal to $1 \times 10^{16}$ cm$^{-3}$, or the third layer 113 may not be doped with an n-type dopant. A dopant may be selected from all of the various kinds of dopants doped on an n-type semiconductor layer.

A thickness of the first layer 111 may be 40% to 50%, a thickness of the third layer 113 may be 40% to 50%, and a thickness of the second layer 112 may be 10% to 20%, with respect to a total thickness of the substrate 110. In an example, when the thickness of the substrate 110 is 100 μm, the thickness of each of the first layer 111 and the third layer 113 may be 40 μm, and the thickness of the second layer 112 may be 20 μm.

Referring to FIG. 4, since the reflective electrode layer 132 is formed on the other surface of the light emitting structure 120 and the sidewalls S of the first groove, most of the light emitted from the active layer 122 may be reflected upwardly by the reflective electrode layer 132. Therefore, external quantum efficiency can be increased. Side surfaces of the light emitting structure and the reflective electrode layer 132 may be insulated from each other by the first insulating layer 141.

On the other hand, when a reflective electrode 16 is formed only below a second semiconductor layer 14 as shown in FIG. 5, light L1 emitted through side surfaces of a light emitting structure is lost. In addition, since a first ohmic electrode 17 absorbs light L2, it is important to reduce a contact area of the first ohmic electrode 17.

Table 1 below is a table showing measurement results of a change in operating voltage when a ratio of the first ohmic electrode is changed.

TABLE 1

|  | Example 1 | Example 2 | Example 3 |
|---|---|---|---|
| Chip Area (μm$^2$) | 640,000 | 640,000 | 1,000,000 |
| Active Area (μm$^2$) | 365,761 | 396,009 | 793,571 |
| Active ratio (%) | 57.2 | 61.9 | 79.4 |
| n-contact Area (μm$^2$) | 44,489 | 32,342 | 17,955 |
| n-contact ratio (%/Active) | 12.16 | 8.17 | 2.26 |
| Reflector Area (μm$^2$) | 317,213 | 364,266 | 744,748 |
| Reflector ratio (%/Active) | 86.7 | 92.0 | 93.9 |
| Operating Voltage (V) @ 350 mA | 3.37 | 3.3 | 3.15 |

Referring to Table 1, in the case of Example 1, it can be seen that an n-contact ratio was 12% of a total area of the active layer and an operating voltage was 3.37 V (based on a current of 350 mA). In comparison, in the case of Example 2, although an n-contact ratio was 8.17% of the total area of the active layer, i.e., was reduced by about 4% compared to Example 1, an operating voltage was measured and was nearly similar to that of Example 1. In addition, in the case of Example 3, although an n-contact ratio was 2.26% of the total area of the active layer, i.e., was reduced by about 10% compared to Example 1, an operating voltage was measured and was nearly similar to that of Example 1. Therefore, a surface layer of a substrate is considered to form a sufficient current distribution path.

A contact area between the first ohmic electrode and the first semiconductor layer may be 1% to 10% or 2% to 3% of the total area of the active layer. In this case, a light loss can be prevented by reducing the contact area.

In addition, as the contact area is reduced, a reflection area can be increased. In the case of Example 3, since a reflection area is large, i.e., 93.9% of the total area of the active layer, most of light can be reflected. Therefore, external quantum efficiency can be improved.

Figure 6:
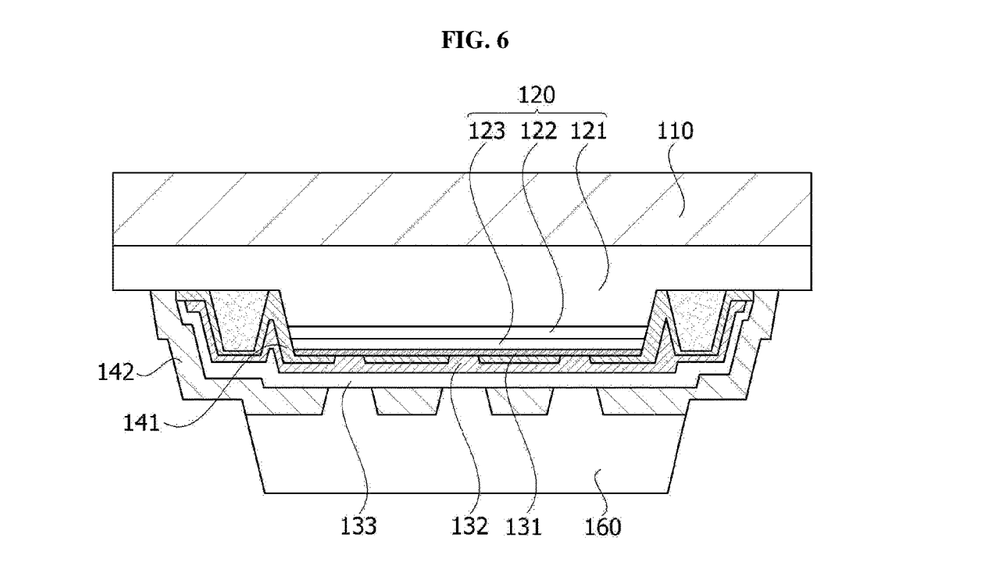
FIG. 6 is a cross-sectional view taken along line B-B of FIG. 1.
Figure 7:
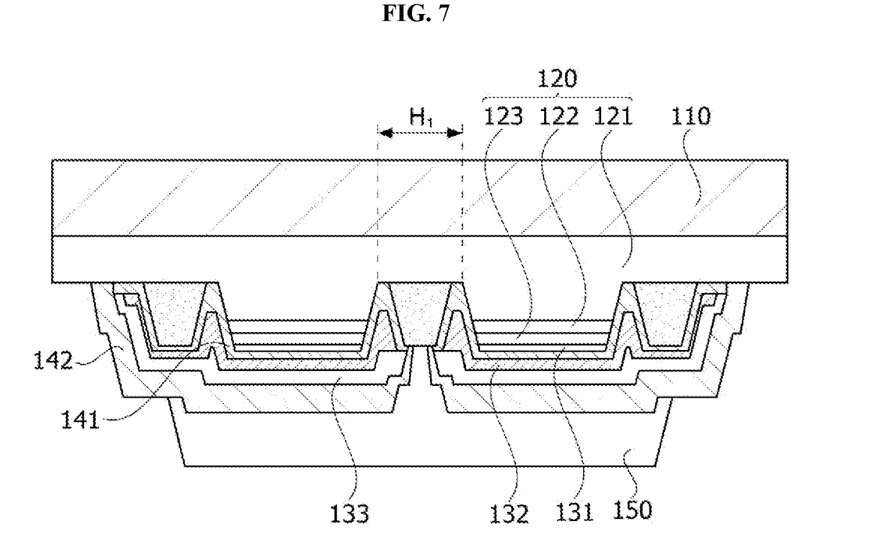
FIG. 7 is a cross-sectional view taken along line C-C of FIG. 1.
Figure 8:
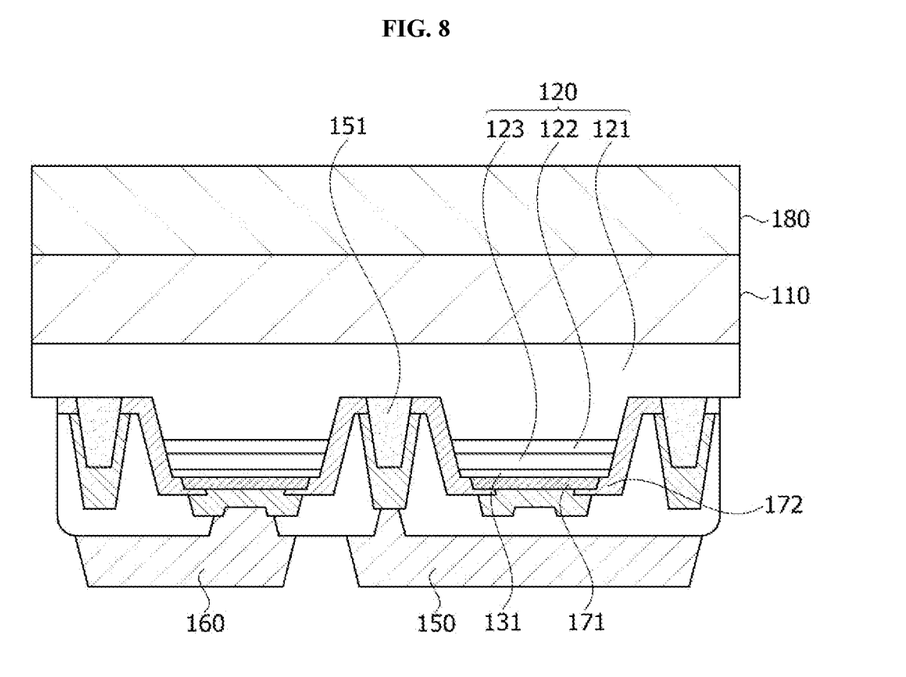
FIG. 8 is a view illustrating that a wavelength conversion layer is disposed in the light emitting device of FIG. 1.

FIG. 6 is a cross-sectional view taken along line B-B of FIG. 1. FIG. 7 is a cross-sectional view taken along line C-C of FIG. 1. FIG. 8 is a modified example of FIG. 2.

Referring to FIG. 6, since portions of the first insulating layer 141 formed on the other surface of the light emitting structure 120 are spaced apart from each other, the second ohmic electrode 131 and the reflective electrode layer 132 may be electrically connected. The second electrode pad 160 may penetrate the second insulating layer 142 and may be electrically connected to the reflective electrode layer 132. Referring to FIG. 7, the first ohmic electrode 151 electrically connected to the first semiconductor layer 121 through the first groove H1 may be electrically connected to the first electrode pad 150 penetrating the second insulating layer 142.

Referring to FIG. 8, a wavelength conversion layer 180 may be disposed on the substrate 110. Light having a blue wavelength band, emitted from the active layer 122, may be converted into white light by the wavelength conversion layer 180. The wavelength conversion layer 180 may be disposed on side surfaces of the substrate 110 and side surfaces of the light emitting structure. A package having such a structure may be a chip scale package (CSP).

The wavelength conversion layer 180 may be formed by dispersing a fluorescent material, a quantum dot, or the like in a polymer resin. The kind fluorescent material is not particularly limited. The fluorescent material may include any one selected from a YAG-based fluorescent material, a TAG-based fluorescent material, a silicate-based fluorescent material, a sulfide-based fluorescent material, and a nitride-based fluorescent material.

In addition, a reflective electrode 171 may be disposed on a lower portion of the second ohmic electrode 131. Light scattering particles such as $TiO_2$ may be dispersed in a first insulating layer 172, such that the first insulating layer 172 may function as a reflective layer.

Figure 9A:
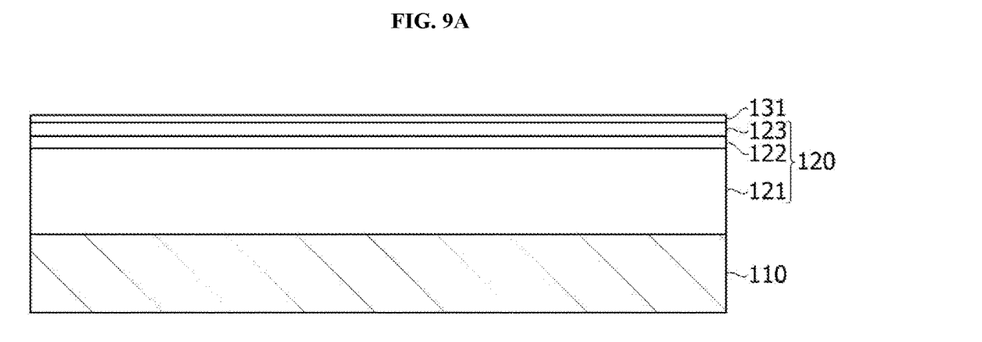
FIGS. 9A to 9H are views illustrating a method of manufacturing the light emitting device according to the exemplary embodiment of the present invention.
Figure 9B:
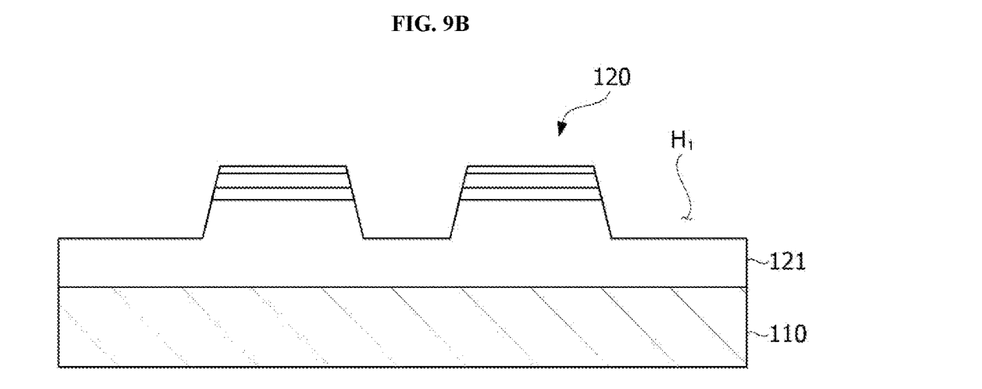

Referring to FIG. 9A, the first semiconductor layer 121, the active layer 122, and the second semiconductor layer 123 are sequentially formed on the substrate 110. Since the substrate 110 is a GaN substrate, a lattice mismatch may be prevented between the substrate 110 and the semiconductor layers. Therefore, a buffer layer may be omitted. The light emitting structure 120 may be grown on a Ga-surface of the substrate 110. The second ohmic electrode 131 may be formed on the second semiconductor layer 123 of the light emitting structure 120. Thereafter, as shown in FIG. 9B, at least one first groove H1 for exposing the first semiconductor layer 121 may be formed by etching the second semiconductor layer 123 and the active layer 122.

Figure 9C:
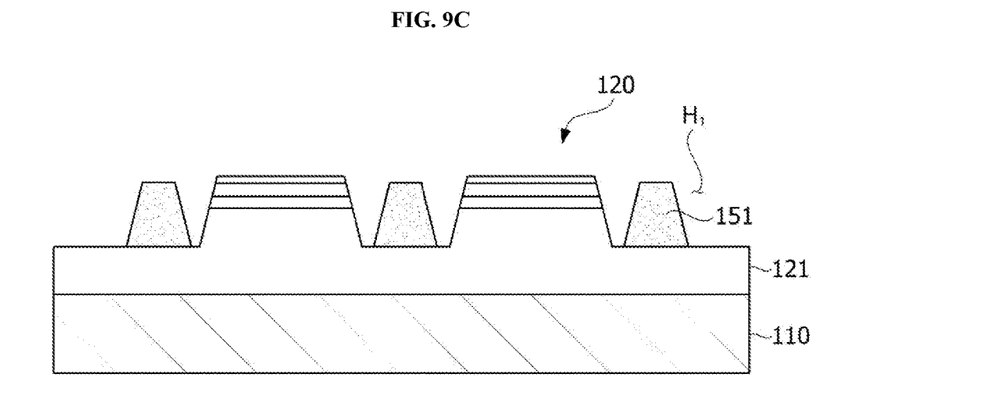

Referring to FIG. 9C, the first ohmic electrode 151 is formed in the first groove H1. A method of forming the first ohmic electrode 151 is not limited. A mask pattern may be used, or a photoresist may be used. A width of the first ohmic electrode 151 may gradually decrease going away from the substrate 110. The first ohmic electrode 151 may be made of one selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SnO, InO, INZnO, ZnO, IrOx, RuOx, NiO, Ti, Al, Ni, Cr, and a selective compound or alloy thereof, and may be formed in at least one layer.

Figure 9D:
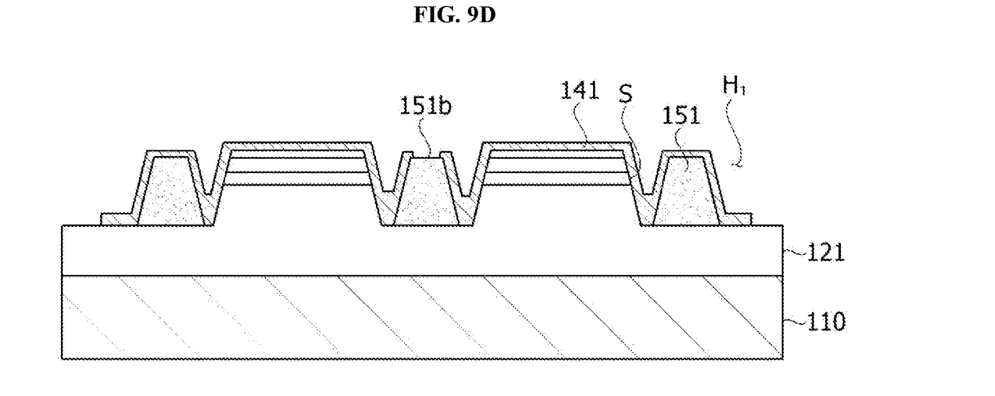

Referring to FIG. 9D, the first insulating layer 141 is formed on the light emitting structure 120 and the first ohmic electrode 151. The first insulating layer 141 may be continuously formed on the other surface of the light emitting structure 120, the sidewalls S of the first groove H1, and side surfaces of the first ohmic electrode 151. That is, the first insulating layer 141 may be entirely formed in the remaining regions excluding an upper surface 151b of the first ohmic electrode.

Figure 9E:
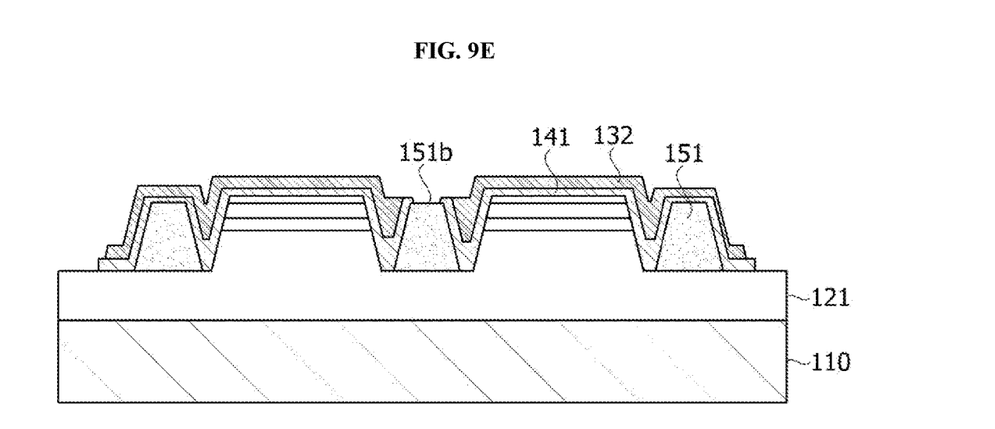

Referring to FIG. 9E, the reflective electrode layer 132 may be directly formed on the first insulating layer 141. That is, the reflective electrode layer 132 may be entirely formed in the remaining regions except for the upper surface 151b of the first ohmic electrode. The reflective electrode layer 132 may be formed by repeatedly stacking a dielectric layer and a metal layer.

Figure 9F:
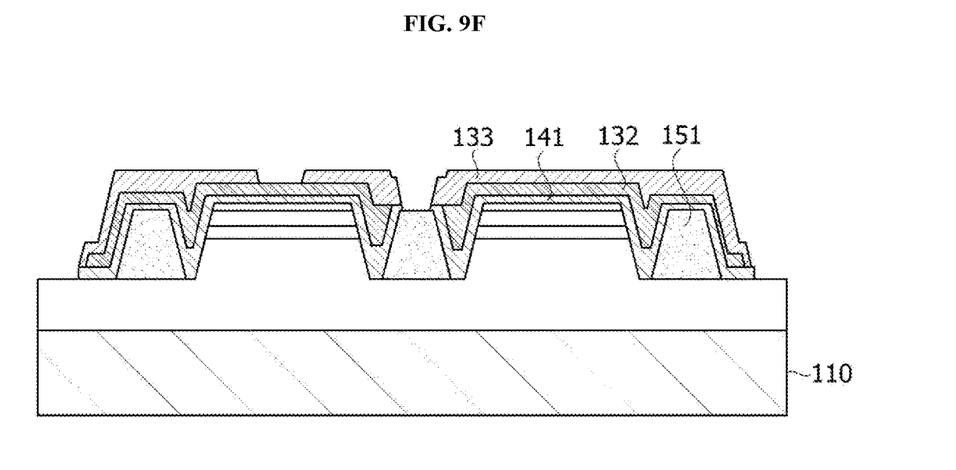

Referring to FIG. 9F, the capping electrode 133 is formed on the reflective electrode layer 132. The capping electrode 133 may perform at least one of a role of preventing diffusion, a role of distributing a current, and a role of protecting the reflective electrode layer 132. The capping electrode 133 may be made of one selected from Au, Cu, Hf, Ni, Mo, V, W, Rh, Ru, Pt, Pd, La, Ta, Ti, Al, and an alloy of at least two thereof.

Figure 9G:
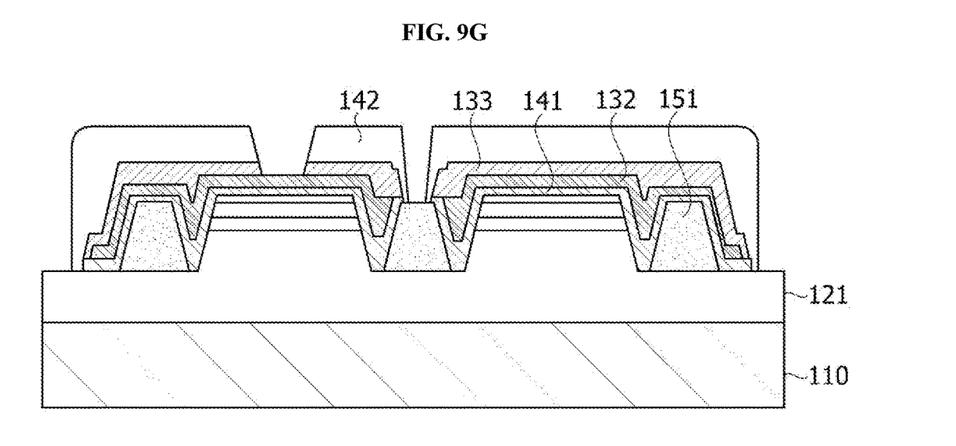
Figure 9H:
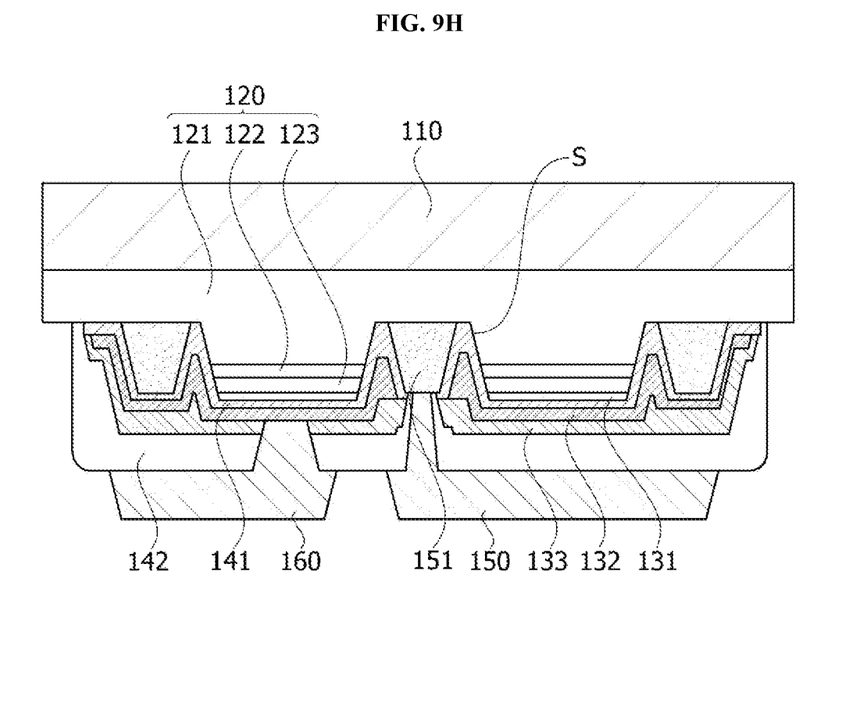

Referring to FIGS. 9G and 9H, the second insulating layer 142 may be formed on the capping electrode 133, and the first electrode pad 150 and the second electrode pad 160 may be allowed to penetrate the second insulating layer 142 and may respectively be electrically connected to the ohmic electrodes.

The light emitting device according to the exemplary embodiment may further include optical members, such as a light guide plate, a prism sheet, and a diffusion sheet, to function as a backlight unit. In addition, the light emitting device according to the exemplary embodiment may be further applied to a display device, a lighting device, and an indicating device.

Here, the display device may include a bottom cover, a reflective plate, a light emitting module, a light guide plate, an optical sheet, a display panel, an image signal output circuit, and a color filter. The bottom cover, the reflective plate, the light emitting module, the light guide plate, and the optical sheet may constitute a backlight unit.

The reflective plate is disposed on the bottom cover, and the light emitting module emits light. The light guide plate is disposed in front of the reflective plate and guides light emitted from the light emitting module in a forward direction, and the optical sheet includes a prism sheet and the like and is disposed in front of the light guide plate. The display panel is disposed in front of the optical sheet, the image signal output circuit supplies an image signal to the display panel, and the color filter is disposed in front of the display panel.

The lighting device may include a substrate, a light source module including the light emitting device according to the exemplary embodiment, a heat dissipater for dissipating heat of the light source module, and a power supply for processing or converting an electrical signal supplied from the outside and supplying the processed or converted electrical signal to the light source module. In addition, the lighting device may include a lamp, a head lamp, a street lamp, or the like.

The above-described present invention is not limited to the above-described exemplary embodiments and the drawings, and it should be apparent to those skilled in the art that various substitutions, modifications, and variations are possible within a range that does not depart from the technical idea of the exemplary embodiment.

The invention claimed is:

1. A light emitting device comprising:
   a substrate including two gallium nitride (GaN) layers having respective different dopant concentrations;
   a light emitting structure including a first semiconductor layer, an active layer, and a second semiconductor layer, and having a groove which passes through the second semiconductor layer, the active layer, and a portion of the first semiconductor layer;
   a reflective electrode layer covering a surface of the second semiconductor layer opposite to active layer and a portion of the sidewalls of the groove;
   a first ohmic electrode positioned in the groove and electrically connected to the first semiconductor layer; and
   a first insulating layer positioned between the first ohmic electrode and the reflective electrode layer.

2. The light emitting device of claim 1, wherein the first insulating layer is positioned between the reflective electrode layer and the light emitting structure.

3. The light emitting device of claim 1, wherein the light emitting device further comprises:
   a second insulating layer contacting the reflective electrode layer;
   a first electrode pad penetrating the second insulating layer so as to be electrically connected to the first ohmic electrode; and
   a second electrode pad penetrating the second insulating layer so as to be electrically connected to a second ohmic electrode and the reflective electrode layer.

4. The light emitting device of claim 3, wherein a cross-sectional area of the first ohmic electrode gradually increases toward the substrate, and a cross-sectional area of the first electrode pad gradually decreases toward the substrate.

5. The light emitting device of claim 1, wherein the reflective electrode layer is electrically connected to the second semiconductor layer.

6. The light emitting device of claim 1, wherein a contact area between the first ohmic electrode and the first semiconductor layer is 1% to 10% of a total area of the active layer.

7. The light emitting device of claim 1, wherein the two GaN layers of the substrate include a first GaN layer in contact with the first semiconductor layer, and the first GaN layer includes a dopant.

8. The light emitting device of claim 7, wherein the GaN layers of substrate further include a second GaN layer positioned opposite to the first semiconductor layer and a third GaN layer provided adjacent to the first GaN layer between the first GaN layer and the second GaN layer, the dopant concentration of the first GaN layer being higher than the dopant concentration of third GaN layer.

9. The light emitting device of claim 8, wherein the dopant concentrations of the first GaN layer and the second GaN layer are in a range of $1\times10^{18}$ cm$^{-3}$ to $5\times10^{19}$ cm$^{-3}$.

10. The light emitting device of claim 8, wherein the substrate has a thickness of 80 μm to 300 μm, and light extraction protrusions extend from the second GaN layer to a height of 10 μm to 30 μm.

11. The light emitting device of claim 7, wherein a thickness of the first GaN layer is 40% to 50% of a total thickness of the substrate.

12. The light emitting device of claim 7, wherein a thickness of the GaN first layer is greater than a thickness of the first semiconductor layer.

13. The light emitting device of claim 1, wherein a portion of the reflective electrode layer positioned on the sidewall of the groove is positioned at a level closer to the substrate than the active layer.

14. A light emitting device package comprising:
a light emitting device; and
a wavelength conversion layer positioned to convert light emitted by the light emitting device,
wherein the light emitting device includes a light emitting structure having a first semiconductor layer, an active layer, and a second semiconductor layer, and having a groove which passes through the second semiconductor layer, the active layer, and a portion of the first semiconductor layer;
a gallium nitride (GaN) substrate positioned on the first semiconductor layer, including two gallium nitride (GaN) layers having respective different dopant concentrations;
a reflective electrode layer covering a surface of the second semiconductor layer opposite to the second active layer and a portion of sidewalls of the groove;
a first ohmic electrode positioned in the groove and electrically connected to the first semiconductor layer; and
a first insulating layer positioned between the first ohmic electrode and the reflective electrode layer.

15. The light emitting device package of claim 14, wherein the light emitting device further includes:
a second insulating layer contacting the reflective electrode layer;
a first electrode pad penetrating the second insulating layer so as to be electrically connected to the first ohmic electrode; and
a second electrode pad penetrating the second insulating layer so as to be electrically connected to a second ohmic electrode and the reflective electrode layer.

16. The light emitting device package of claim 14, wherein the reflective electrode layer is electrically connected to the second semiconductor layer.

17. The light emitting device package of claim 14, wherein the GaN layers include a first GaN layer in contact with the first semiconductor layer, a second GaN layer positioned opposite to the first semiconductor layer, and a third GaN layer provided between the first GaN layer and the second GaN layer, the dopant concentration of the first and second GaN layers being higher than the dopant concentration of third GaN layer.

18. The light emitting device package of claim 17, wherein the dopant concentrations of the first GaN layer and the second GaN layer are in a range of $1\times10^{18}$ cm$^{-3}$ to $5\times10^{19}$ cm$^{-3}$.

19. The light emitting device of claim 17, wherein respective thicknesses of the first GaN layer and the second GaN layer are 40% to 50% of a total thickness of the GaN substrate, and a thickness of the third GaN layer is 10% to 20% of the total thickness of the GaN substrate.

20. The light emitting device package of claim 17, wherein the GaN substrate has a thickness of 80 μm to 300 μm, and the second GaN layer includes light extraction protrusions that extend to a height of 10 μm to 30 μm.

* * * * *